(12) United States Patent
Tan et al.

(10) Patent No.: US 11,694,945 B2
(45) Date of Patent: *Jul. 4, 2023

(54) LEAD FRAME PACKAGE HAVING CONDUCTIVE SURFACES

(71) Applicant: Silanna Asia Pte Ltd, Singapore (SG)

(72) Inventors: Ariel Tan, Langkaan Dasmarirnas Cavite (PH); Ren Huei Tzeng, San Diego, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/301,095

(22) Filed: Mar. 24, 2021

(65) Prior Publication Data
US 2021/0210418 A1    Jul. 8, 2021

Related U.S. Application Data

(63) Continuation of application No. 16/577,988, filed on Sep. 20, 2019, now Pat. No. 10,971,434.

(Continued)

(51) Int. Cl.
*H01L 23/495* (2006.01)
*H01L 23/28* (2006.01)
(Continued)

(52) U.S. Cl.
CPC .......... *H01L 23/4951* (2013.01); *H01L 21/56* (2013.01); *H01L 23/28* (2013.01);
(Continued)

(58) Field of Classification Search
CPC ..... H01L 23/4951; H01L 21/56; H01L 23/28; H01L 23/49541; H01L 23/49575;
(Continued)

(56) References Cited

U.S. PATENT DOCUMENTS 10,971,434 B2 *  4/2021  Tan ......................... H01L 23/28
2009/0230517 A1   9/2009  Bathan et al.
(Continued)

FOREIGN PATENT DOCUMENTS

JP     2013149876 A    8/2013
KR    20000004339 A    1/2000
(Continued)

OTHER PUBLICATIONS

"MagI3C Power Module, VDMM—Variable Step Down MicroModule," Data Sheet Rev. 2.0, we-online.com, accessed Sep. 20, 2019.

(Continued)

*Primary Examiner* — Tong-Ho Kim
(74) *Attorney, Agent, or Firm* — MLO, a professional corp.

(57) ABSTRACT

Disclosed is a device including a first finger of a plurality of lead fingers of a lead frame connected to a first flag. A second finger of the plurality of lead fingers of the lead frame is connected to a second flag. A semiconductor die is coupled to the lead frame. An encapsulant covers the semiconductor die, the lead frame, and a first end of the plurality of lead fingers, and excludes the first flag and the second flag. The first flag and the second flag are separated and electrically isolated from one another by the encapsulant.

20 Claims, 11 Drawing Sheets

Related U.S. Application Data

(60) Provisional application No. 62/842,379, filed on May 2, 2019.

(51) Int. Cl.
*H01L 21/56* (2006.01)
*H01L 21/60* (2006.01)

(52) U.S. Cl.
CPC .. *H01L 23/49541* (2013.01); *H01L 23/49575* (2013.01); *H01L 2021/6027* (2013.01)

(58) Field of Classification Search
CPC . H01L 2021/6027; H01L 24/49; H01L 24/83; H01L 25/16; H01L 23/49513; H01L 23/49582; H01L 24/32; H01L 24/48; H01L 24/73; H01L 24/85; H01L 24/92; H01L 23/49551; H01L 23/49562; H01L 2224/32245; H01L 2224/48247; H01L 2224/48465; H01L 2224/48471; H01L 2224/4945; H01L 2224/73265; H01L 2224/83805; H01L 2224/8385; H01L 2224/85181; H01L 2224/85186; H01L 2224/92247; H01L 2924/00014; H01L 2924/07802; H01L 2924/0781
USPC ......................................................... 257/676
See application file for complete search history.

(56) References Cited

U.S. PATENT DOCUMENTS

| 2010/0123227 A1 | 5/2010 | Dahilig et al. |
| 2011/0227207 A1 | 9/2011 | Yilmaz et al. |
| 2013/0001756 A1 | 1/2013 | Chen et al. |
| 2015/0237721 A1 | 8/2015 | Choh et al. |

FOREIGN PATENT DOCUMENTS

| KR | 20120101886 A | 9/2012 |
| WO | 2018011133 A1 | 1/2018 |

OTHER PUBLICATIONS

International Search Report dated Jul. 29, 2020 for PCT Patent Application No. PCT/IB2020/053873).
MagI3C-VDMM Variable Step Down MicroModule, accessed Sep. 20, 2019; https://katalog.we-online.com/en/pm/MAGIC-VDMM?m=t&sq=variable+step+down+micromodule&sp=https%3A%2F%2Fwww.we-online.com%2Fweb%2Fen%2Felectronic_components%2Fsearchpage_PBS.php%3Fsearch%3DVariable%2BStep%2BDown%2BMicroModule&_ga=2.161658943.2039660800.1563217063-233027627.1563217063.
Office Action dated Dec. 11, 2020 for U.S. Appl. No. 16/577,988.
Office Action dated Sep. 30, 2020 for U.S. Appl. No. 16/577,988.

* cited by examiner

LEAD FRAME PACKAGE HAVING CONDUCTIVE SURFACES

RELATED APPLICATIONS

This application is a continuation of U.S. patent application Ser. No. 16/577,988 filed on Sep. 20, 2019, and entitled "Lead Frame Package having Conductive Surface with Integral Lead Finger," which claims priority to U.S. Provisional Patent Application No. 62/842,379 filed on May 2, 2019 and entitled "Integrated Circuit Package with Mounted Passive Components," both of which are hereby incorporated by reference in full.

BACKGROUND

Semiconductor dies with integrated circuits are typically encapsulated in a package to prevent physical damage and corrosion. The package supports electrical contacts such as lead fingers that connect the package to components such as a circuit board. In applications, the size and capability of the package is a consideration because space is limited for the placement of packages and other devices on the same circuit board.

SUMMARY

Disclosed is a device including a first finger of a plurality of lead fingers of a lead frame connected to a first flag. A second finger of the plurality of lead fingers of the lead frame is connected to a second flag. A semiconductor die is coupled to the lead frame. An encapsulant covers the semiconductor die, the lead frame, and a first end of the plurality of lead fingers, and excludes the first flag and the second flag. The first flag and the second flag are separated and electrically isolated from one another by the encapsulant.

Disclosed is a process for forming a lead frame from a material. The lead frame includes a first finger of a plurality of lead fingers connected to a first flag. A second finger of the plurality of lead fingers is connected to a second flag. A semiconductor die is coupled to the lead frame. The semiconductor die is coupled to the first flag and the second flag. The semiconductor die, the lead frame, and a first end of the plurality of lead fingers, excluding the first flag and the second flag, are encapsulated with an encapsulant. The first flag and the second flag are separated and electrically isolated from one another by the encapsulant.

DETAILED DESCRIPTION

The present embodiments disclose a package with a semiconductor die and integrated circuit, and a process for a fabricating the package. The package has exposed sections of the lead frame which are referred to as flags. The flags are a continuous material with the lead fingers and are conductive. A plurality of flags are separated and electrically isolated from one another and therefore, can be used as terminals in a circuit. This enables components such as passive components or non-passive components to be mechanically and electrically connected to the package. The vertical clearance above the package is utilized by mounting the components on top of the package instead of inside of the package, thereby reducing the footprint of the package and the space needed on a circuit board when connecting the package to the circuit board. The process utilizes a stamping method to form the lead frame, enabling the flags or conductive surfaces to be continuous with the lead fingers so that intervening materials or connections are not needed. This reduces the complexity of manufacturing, materials, processes and cost, and increases the robustness and integrity of the circuit.

Figure 1:
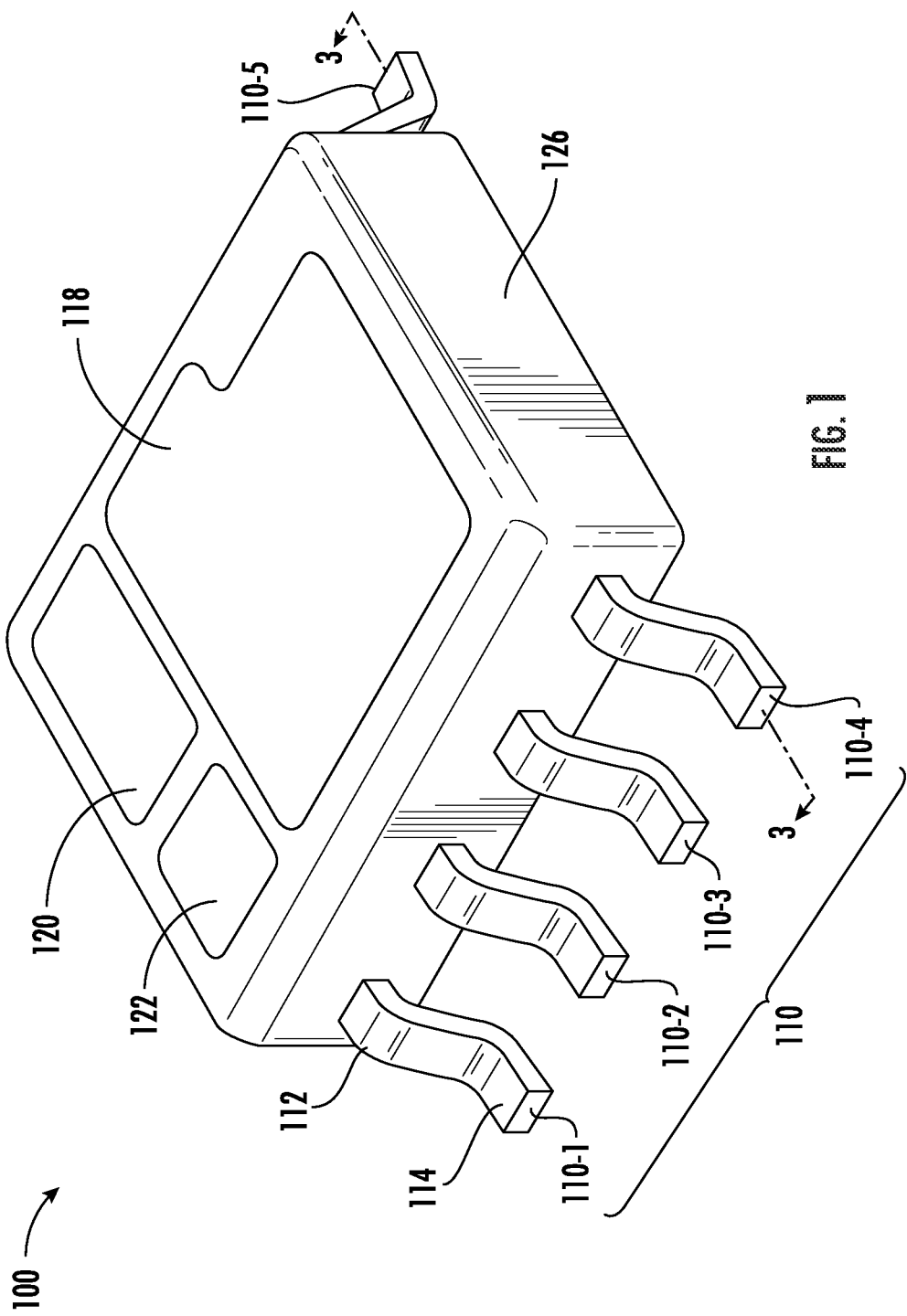
FIG. 1 is a perspective view of a package, in accordance with some embodiments.
Figure 2:
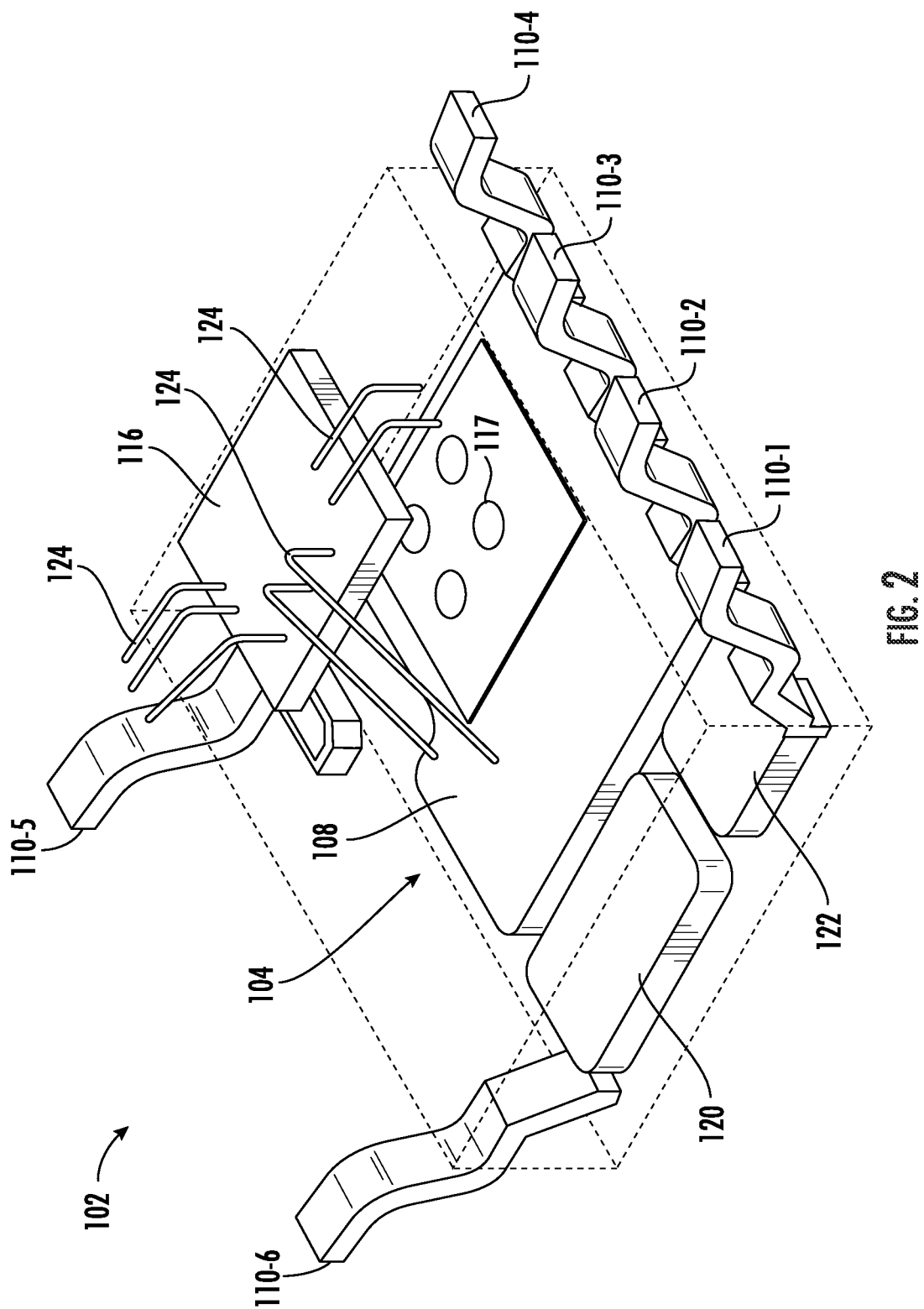
FIG. 2 shows a perspective view of a lead frame of the package, in accordance with some embodiments.
Figure 3:
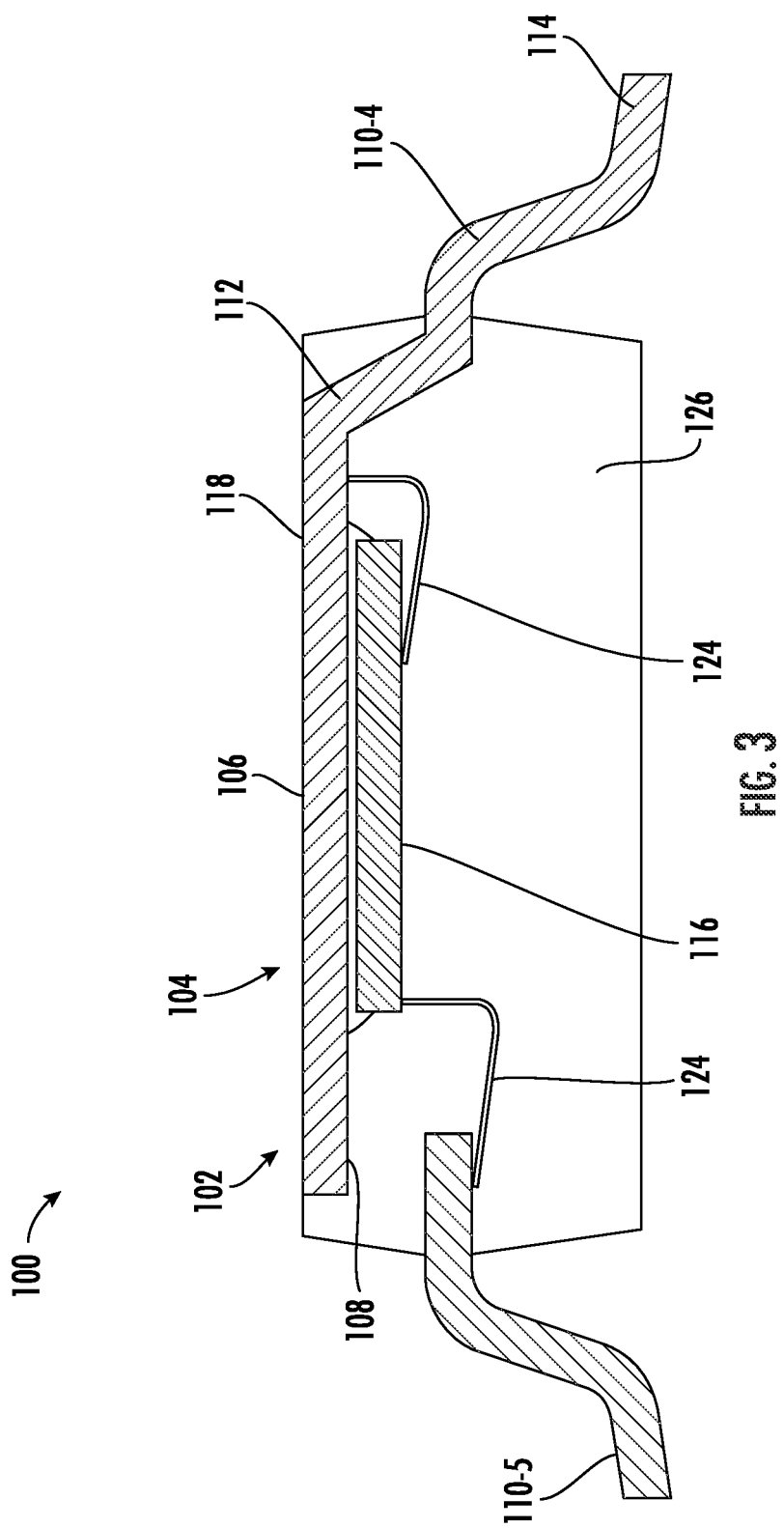
FIG. 3 shows a cross-sectional view of the package from FIG. 1, in accordance with some embodiments.

FIG. 1 is a perspective view of a package 100, in accordance with some embodiments, FIG. 2 shows a perspective view of a lead frame 102 of the package 100, in accordance with some embodiments, and FIG. 3 shows a cross-sectional view of the package 100 from FIG. 1, in accordance with some embodiments. Referring to FIGS. 2 and 3, a lead frame 102 comprised of metal has a body 104 with a top surface 106 and a bottom surface 108, and a plurality of lead fingers 110. In some embodiments, the body 104 may be comprised of a single section or a plurality of sections which may or may not be attached to one another. There may be any number of lead fingers 110 arranged in different combinations depending on the application. The lead fingers 110 allow electrical signals to be received by and transmitted from one or more semiconductor dies to a circuit board, or another component.

For example, as shown in FIG. 2, the lead frame 102 may have six lead fingers 110-1 through 110-6 arranged with four lead fingers 110-1 through 110-4 on one side of the body 104 and two lead fingers 110-5 and 110-6 on the other side of the body 104. Other embodiments may include more or fewer lead fingers 110 on each side of the body 104. For example, some embodiments may include eight or more lead fingers 110 on each side of the body 104. As shown in FIG. 3, each lead finger (110-1, 110-2, . . . 110-N) has a first end 112 and a second end 114. The first end 112 of the lead finger 110 is attached to the body 104 and in some embodiments, the second end 114 is in a different plane than the first end 112 and the body 104. For example, the second end 114 may be vertically displaced from the first end 112, laterally displaced from the first end 112 or both vertically and laterally displaced from the first end 112. A semiconductor die 116 with an integrated circuit is coupled to the bottom surface 108 of the body 104. The coupling may be via insulating or conductive epoxy, glue, or eutectic bonding, or other semiconductor die bonding processes known in the art. FIG. 2 shows an example of conductive epoxy pads 117 between the bottom surface 108 of the body 104 and the semiconductor die 116.

A first flag 118 is a first exposed portion of the top surface 106 of the body 104 of the lead frame 102. The first flag 118 is integral with the first end 112 of a first lead finger 110-2 of the plurality of lead fingers 110. In others words, the first flag 118 and the first lead finger 110-2 are a continuous material which is conductive. There are no intervening materials, attachment points, breaks, disruptions or interruptions between the first flag 118 and the first lead finger 110-2 because it is the same piece of material (as shown in FIG. 3). Depending on the size of the first flag 118, other lead fingers 110 may be integral with the first flag 118 and be part of the continuous material. Referring to FIG. 2, lead fingers 110-3 and 110-4 are also a continuous material with the first flag 118. The first exposed portion of the top surface 106 of the body 104 of the lead frame 102 (e.g., the first flag 118) to the second end 114 of the first lead finger 110-2 is one piece of material.

A second flag 120 (shown in FIG. 2) is a second exposed portion of the top surface 106 of the body 104 of the lead frame 102 and integral with the first end 112 (shown in FIG. 4) of a second lead finger 110-6 of the plurality of lead fingers 110. Similar to the first flag 118 and the first lead finger 110-2, the second flag 120 and the second lead finger 110-6 are a continuous material. The second flag 120 (e.g., the second exposed portion of the top surface 106 of the body 104 of the lead frame 102) and the second lead finger 110-6 are conductive surfaces without a connection, intermediate material, break, disruption or interruption between. The second exposed portion of the top surface 106 of the body 104 of the lead frame 102 (e.g., the second flag 120) to the second end 114 of the second lead finger 110-6 is one piece of material.

The package 100 may also include a third flag 122 (shown in FIG. 2) which is a third exposed portion of the top surface 106 of the body 104 of the lead frame 102 and integral with the first end 112 of a third lead finger 110-1 of the plurality of lead fingers 110. Similar to the first flag 118 and the first lead finger 110-2, and the second flag 120 and the second lead finger 110-6, the third flag 122 and the third lead finger 110-1 are a continuous material because it is the same piece of material. In this way, there is no need for an intervening material, attachment point, connection, break, disruption or interruption between the third flag 122 and the second end 114 of the third lead finger 110-1. The third flag 122 and the third lead finger 110-1 are conductive surfaces. In further embodiments, there may be additional flags which are exposed portions of the body 104 of the lead frame 102 and are conductive surfaces. Each additional flag is a continuous material with at least one corresponding lead finger. The additional flag and at least one corresponding lead finger is the same piece of material.

Figure 4A:
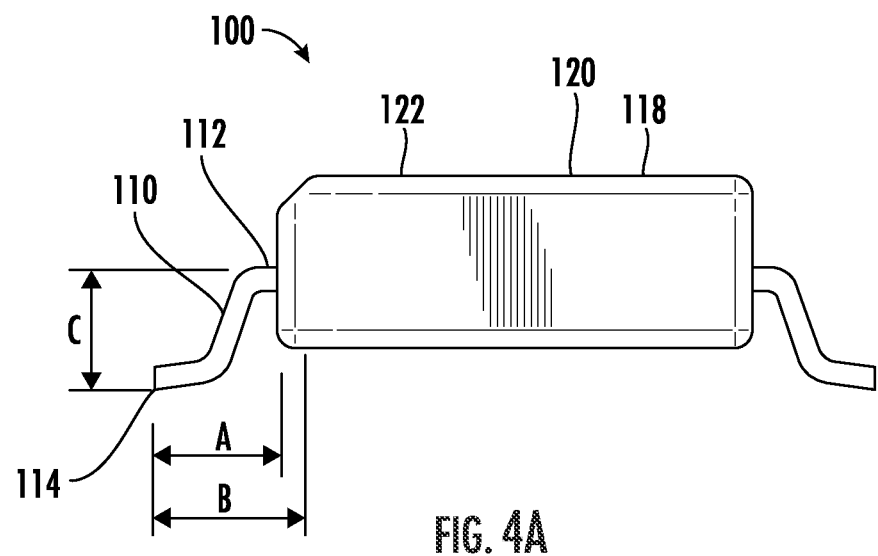
FIG. 4A depicts a side view of the package, in accordance with some embodiments.
Figure 4B:
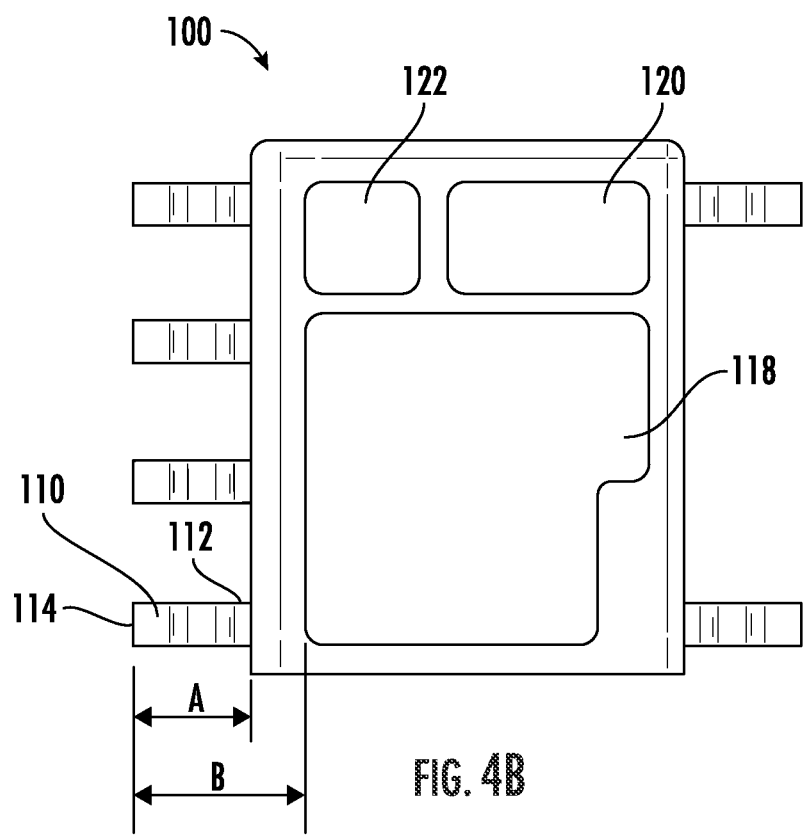
FIG. 4B depicts a top view of the package, in accordance with some embodiments.

FIG. 4A depicts a side view of the package 100, in accordance with some embodiments, and FIG. 4B depicts a top view of the package 100, in accordance with some embodiments. The first end 112 of the lead finger 110 is integral with the body 104, and the second end 114 of the lead finger 110 extends from the package 100. For example, the lead fingers 110 may be a gull wing design and foldout from the package 100 in the shape of an "L" or "J". The second end 114 of each lead finger 110 of the plurality of lead fingers 110 is laterally displaced from the package 100 by a distance as indicated by A. The second end 114 of each lead finger 110 of the plurality of lead fingers 110 are therefore also laterally displaced from the first end 112 of the plurality of lead fingers 110. The second end 114 of each lead finger 110 of the plurality of lead fingers 110 is laterally displaced from, for example, the first flag 118 by a distance as indicated by B. The second end 114 of the lead finger 110 is vertically displaced from the first end 112 of the lead finger 110 (by a distance as indicated by C) so that the first end 112 and the second end 114 of the lead finger 110 are in different planes. The distances of A-C may be chosen and optimized based on the design application. For example, the distance A may be 1.2 mm to 1.6 mm, and distances B and C may be 1.3 mm to 1.7 mm. In some embodiments, distances B and C may be the same. These distances are similar for the other flags 120 and 122 and corresponding the lead fingers 110.

Referring to FIG. 1, an encapsulant 126 covers or encapsulates the semiconductor die 116, the bottom surface 108 of the body 104, the first end 112 of the plurality of lead fingers 110 and a portion of the top surface 106 of the body 104 forming a housing for the package 100. The encapsulant 126 may be comprised of a composite, plastic, ceramic or glass. The encapsulant 126 helps prevent physical damage and corrosion of the semiconductor die 116 and other interior components. The first flag 118, the second flag 120, and the third flag 122 are separate from one another and electrically isolated from one another by the encapsulant. The flags such as the first flag 118, the second flag 120 and the third flag 122—as well as any additional flags—include conductive surfaces. The semiconductor die 116 is electrically connected to the first flag 118, the second flag 120 and the third flag 122 by wire 124 connections (see FIGS. 2 and 3). Because the first flag 118, the second flag 120, and the third flag 122 are separated and electrically isolated from one another, each can each serve as a terminal in an electrical circuit.

Figure 5:
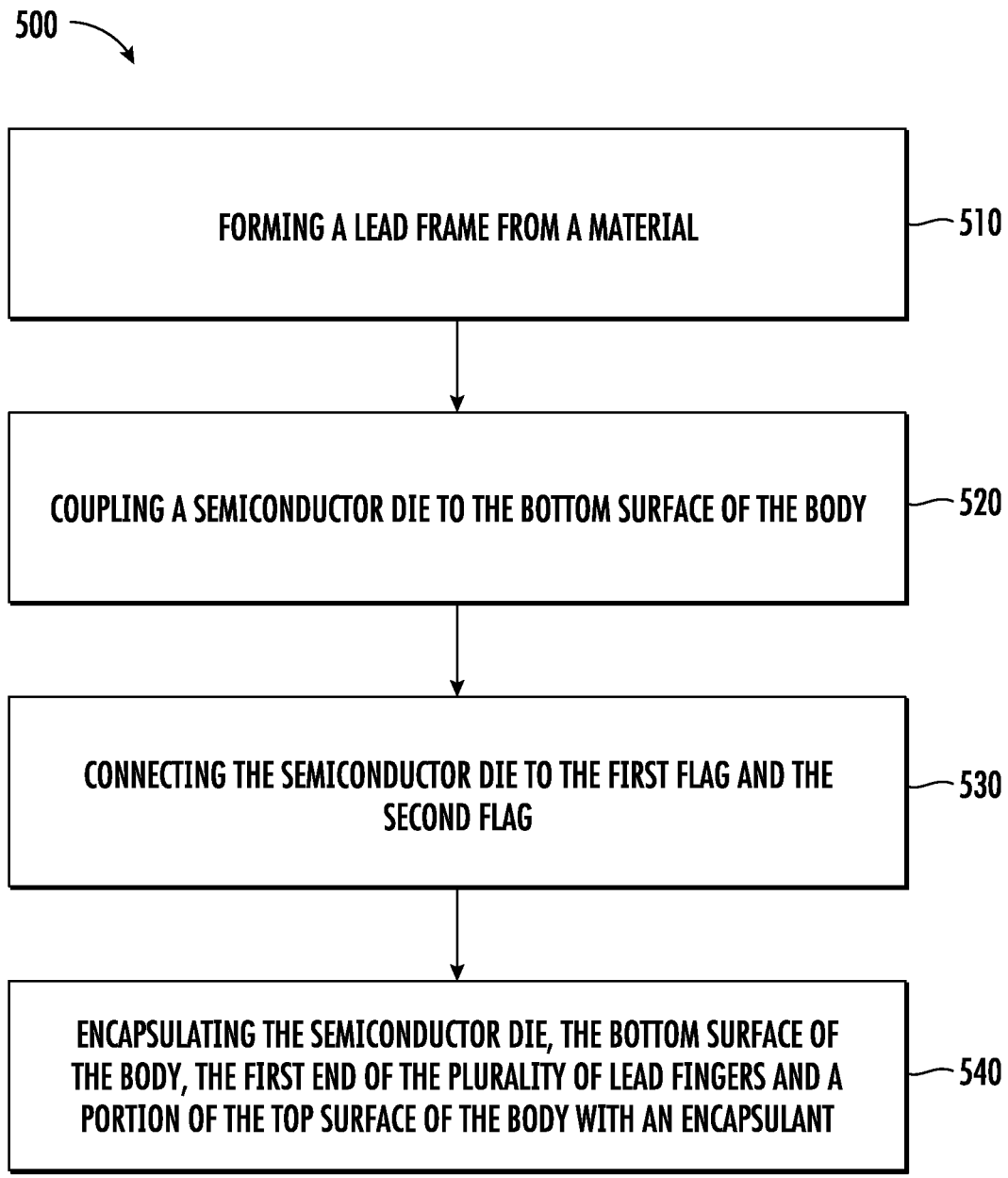
FIG. 5 is a flowchart of a process for forming the package, in accordance with some embodiments.

FIG. 5 is a flowchart of a process 500 for forming the package 100, in accordance with some embodiments, and FIGS. 6A-6D are schematics for the process 500 for forming the package 100, in accordance with some embodiments. At step 510 and in FIG. 6A which depicts a bottom view of a lead frame 102 formed by process 500, the lead frame 102 is formed from a material. In some embodiments, the lead frame 102 is formed from a metal (e.g., copper or a copper-alloy) by a stamping process. In other embodiments, the lead frame 102 is formed from a metal using an etching process. In still yet other embodiments, the lead frame 102 is formed from a metal by a molding process. The lead frame 102 has been described herein as having a body 104 with a top surface 106 and a bottom surface 108. In some embodiments, the body 104 may have a plurality of sections such as 104A, 104B, . . . 104N which may or may not be attached to one another. Each section of the body 104 is attached to at least one lead finger 110 of the plurality of lead fingers 110. The section of the body 104 and at least one lead finger 110 are a single, continuous material. For example, the body section 104A is continuous with the lead fingers 110-2, 110-3, and 110-4, the body section 104B is continuous with the lead finger 110-6, the body section 104C is continuous with the lead finger 110-1, and the body section 104D is continuous with the lead finger 110-5. There are no intermediate materials, connections, breaks, disruptions or interruptions between the body section and at least one corresponding lead finger.

In some embodiments, the shape of the lead frame 102 may be achieved by a stamping process where a single piece of material (e.g., copper or a copper alloy) is stamped into the desired shape. For example, the lead frame 102 may be formed with a downset or cavity which may be the location for mounting the semiconductor die 116. As described, each lead finger 110 has a first end 112 and a second end 114 which can be formed in a particular way using the stamping process where a tool and die surface forms the material into a finished, desired shape. In some embodiments, the first end 112 is attached to the body 104 and the second end 114 is laterally and vertically displaced from the first end 112 and the body 104 (as shown in FIGS. 1-3).

The first flag 118 is formed on the lead frame 102 which is the first exposed portion of the top surface 106 of the body section 104A of the lead frame 102 and integral with the first lead finger 110-2 of the plurality of lead fingers 110. Because the process starts with a single piece of material which may be then formed into the lead frame 102 by the stamping process, the first flag 118 and the first lead finger 110-2 are a continuous material. The second flag 120 is formed as a second exposed portion of the top surface 106 of the body 104 of the lead frame 102. The second flag 120 is integral with a second lead finger 110-6 of the plurality of lead fingers 110, and the second flag 120 and the second lead finger 110-6 are a continuous material. The third flag 122 is formed as a third exposed portion of the top surface 106 of the body 104 of the lead frame 102. The third flag 122 is integral with a third lead finger 110-1 of the plurality of lead fingers 110, and the third flag 122 and the third lead finger 110-1 are a continuous material.

The lead frame 102 may have one or more flags which are exposed portions of the body 104 of the lead frame 102. In some embodiments, the lead frame 102 may have one or more flags of the body 104 of the lead frame 102 which are not exposed (i.e., which are covered by the encapsulant 126). Since the first flag 118, the second flag 120, and the third flag 122 are integral with respective lead fingers 110 which are made of metal, the first flag 118, the second flag 120, the third flag 122 and the respective lead fingers 110 are conductive surfaces without intervening material or additional connections. Moreover, each of the second ends 114 of the respective lead finger 110 are laterally displaced from the first flag 118, the second flag 120, the third flag 122 and the package 100. In some embodiments, pads 128 may be formed on the bottom surface 108 of the lead frame 102 which is the bottom surface of the body sections 104A-104D. The pads 128 may be formed on one or more of the body sections 104A-104D. The pads 128 may be a silver-plated area whereby the silver can be applied on the bottom surface of the body sections 104A-104D with a stencil pattern application which is then cured. Other materials and processes known in the art may be used to form the pads 128.

Figure 6A:
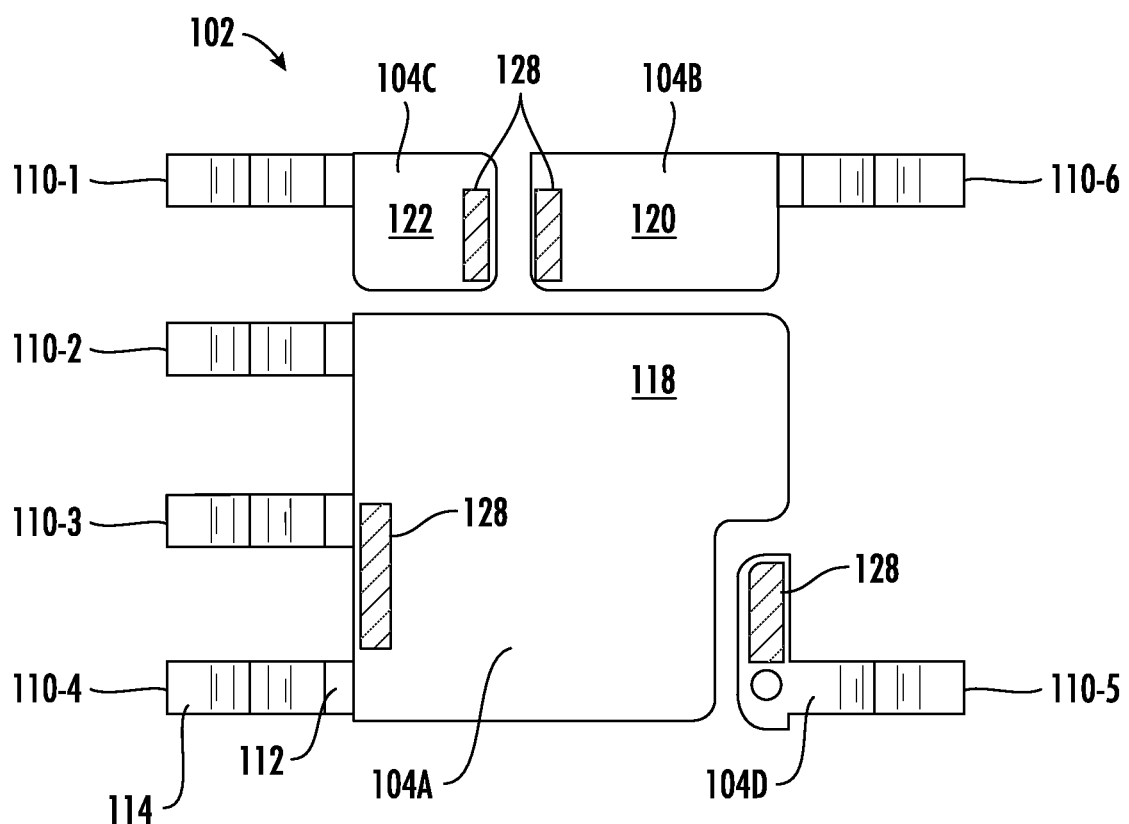
FIGS. 6A-6D are schematics for the process for forming the package, in accordance with some embodiments.
Figure 6B:
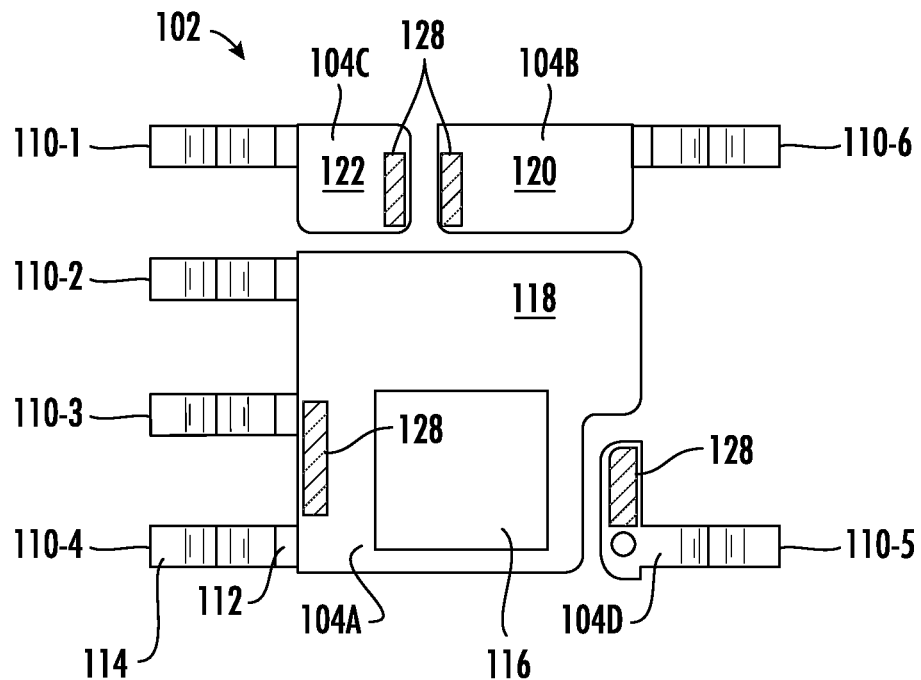
Figure 6C:
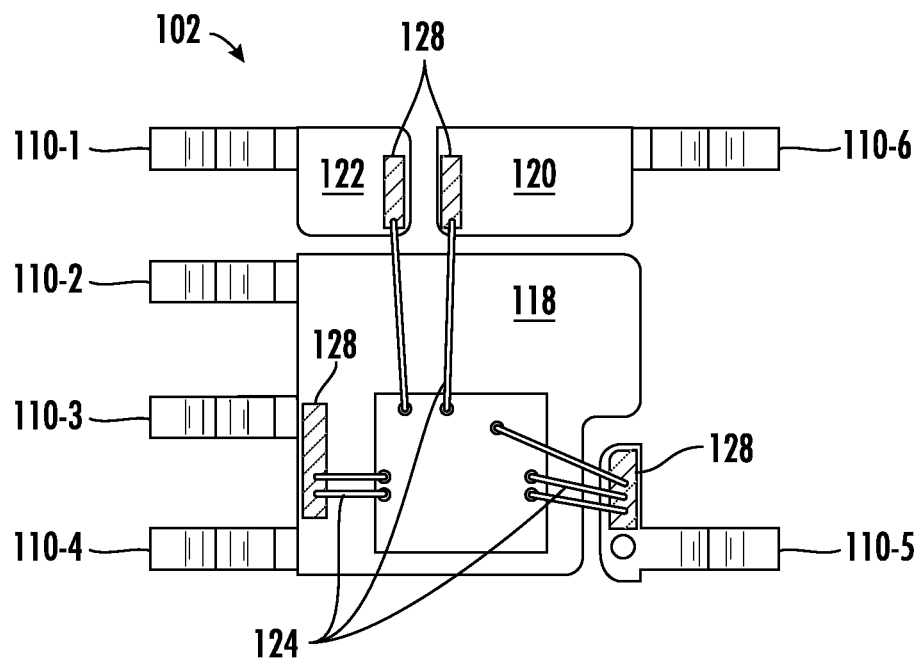

At step 520 and in FIG. 6B which shows a bottom view of lead frame 102 formed by the process 500, the semiconductor die 116 is coupled to the bottom surface 108 of the body section 104A. This may be by a conductive or insulating epoxy bonding process, glue, eutectic bonding process, or by another bonding process known in the art. At step 530 and in FIG. 6C which shows a bottom view of the lead frame 102 formed by the process 500, the semiconductor die 116 is connected by the wires 124 to the pads 128 on the body sections 104A-104D. The body sections 104A-104D, in some embodiments, may correspond to a flag, such as body section 104A and flag 118, body section 104B and flag 120, body section 104C and flag 122. In other words, the semiconductor die 116 is coupled to the first flag 118, the second flag 120, and the third flag 122. This may also be by a conductive or insulating epoxy bonding process, glue, eutectic bonding process, or by another bonding process known in the art. In some embodiments, more or fewer flags of the lead frame 102 are connected to the semiconductor die 116. For example, if other flags are present, the semiconductor die 116 may be connected by wires 124 to each of the other flags of the lead frame 102. As another example, in some embodiments, the semiconductor die 116 is not connected by the wires 124 to any flags of the lead frame 102 and is only bonded to a flag of the lead frame 102.

Figure 6D:
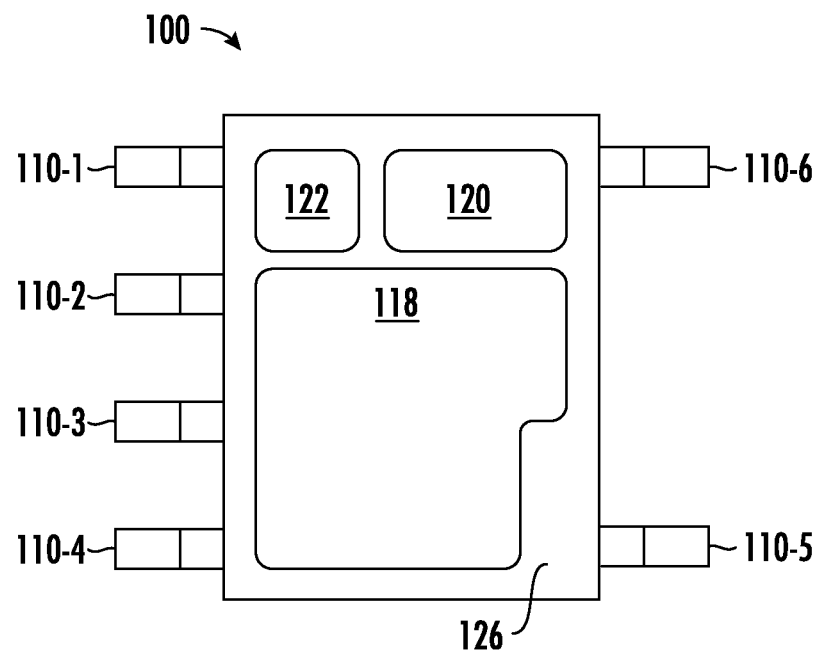

At step 540 and in FIG. 6D showing a top view of the lead frame 102 formed by the process 500, the semiconductor die 116, the bottom surface of the body 104, the first end 112 of the plurality of lead fingers 110 and a portion of the top surface 106 of the body 104 is encapsulated with an encapsulant 126 to form the housing of the package 100. The flags, such as the first flag 118, the second flag 120 and the third flag 122 are exposed portions of the lead frame 102—specifically, portions of the top surface 106 of the body 104—and not encapsulated by the encapsulant 126. The first flag 118, the second flag 120 and the third flag 122 are separated from one another by the encapsulant 126. In this way, the first flag 118, the second flag 120 and the third flag 122 are electrically isolated from one another.

The flags of the package 100 with integral lead fingers 110 are conductive surfaces and can be used in an electrical circuit, thus expanding the capabilities of the package 100. For example, the first flag 118 may be a first terminal of an electrical circuit and the second flag 120 may be a second terminal of the electrical circuit. Moreover, the first flag 118 may be a first terminal of an electrical circuit and the third flag 122 may be a second terminal of the electrical circuit.

Figure 7:
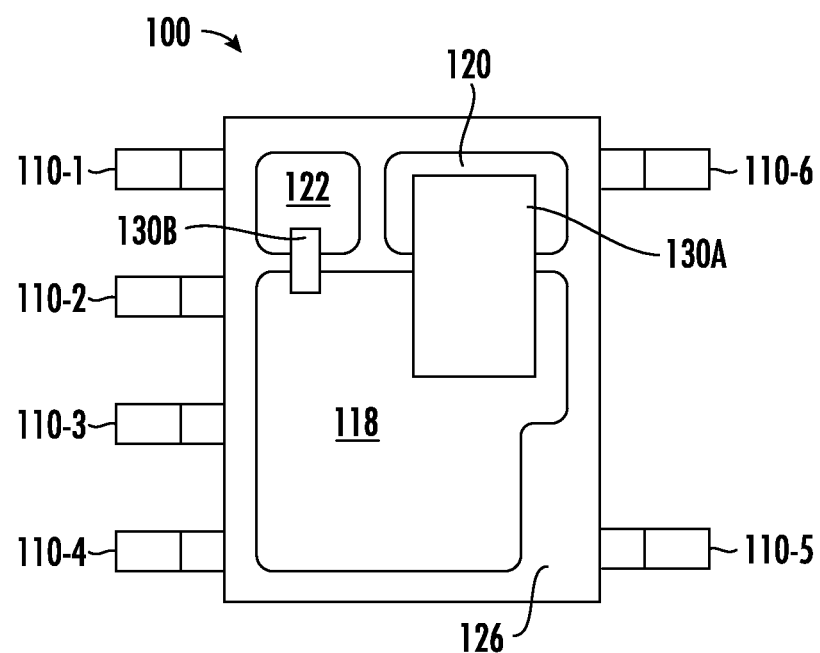
FIG. 7 is a top view of the schematic for a further step in the process for forming the package, in accordance with some embodiments.
Figure 8A:
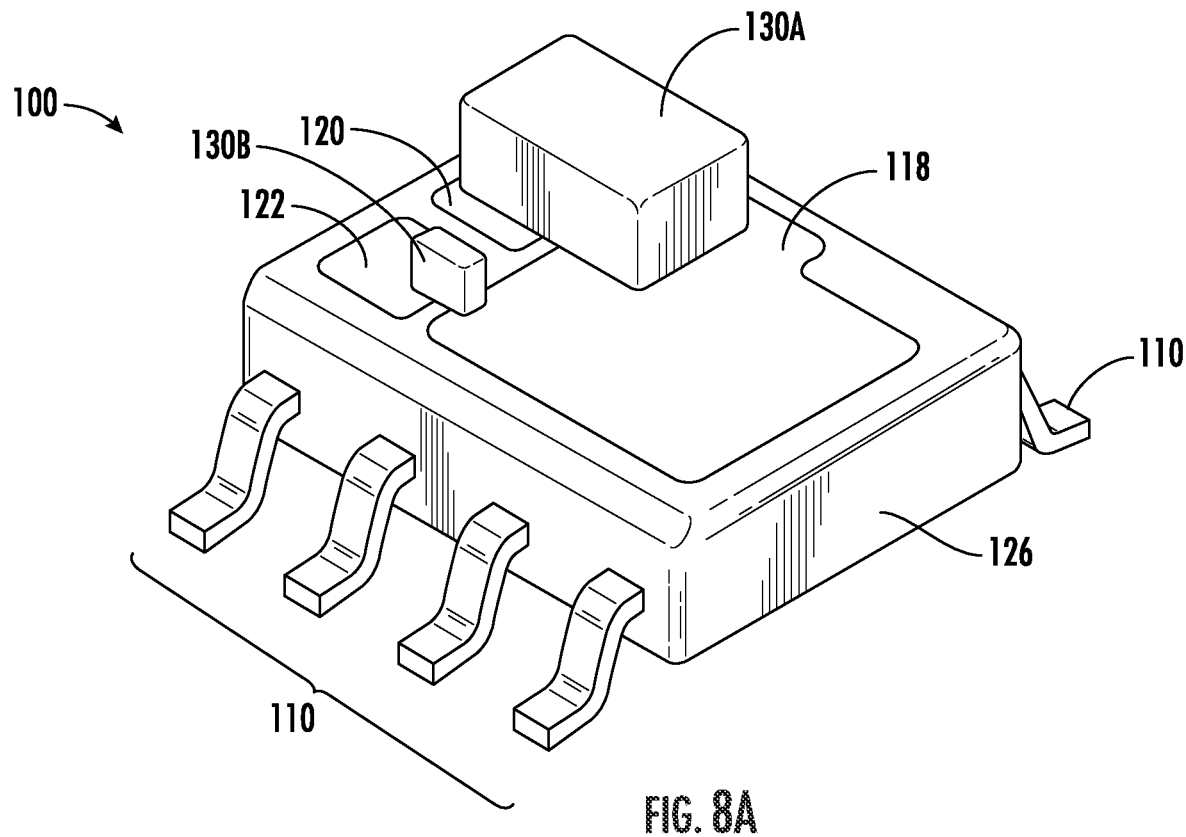
FIGS. 8A-8E are a perspective view, front view, side view, top view and bottom view respectively, of the package with components mounted thereon, in accordance with some embodiments.
Figure 8B:
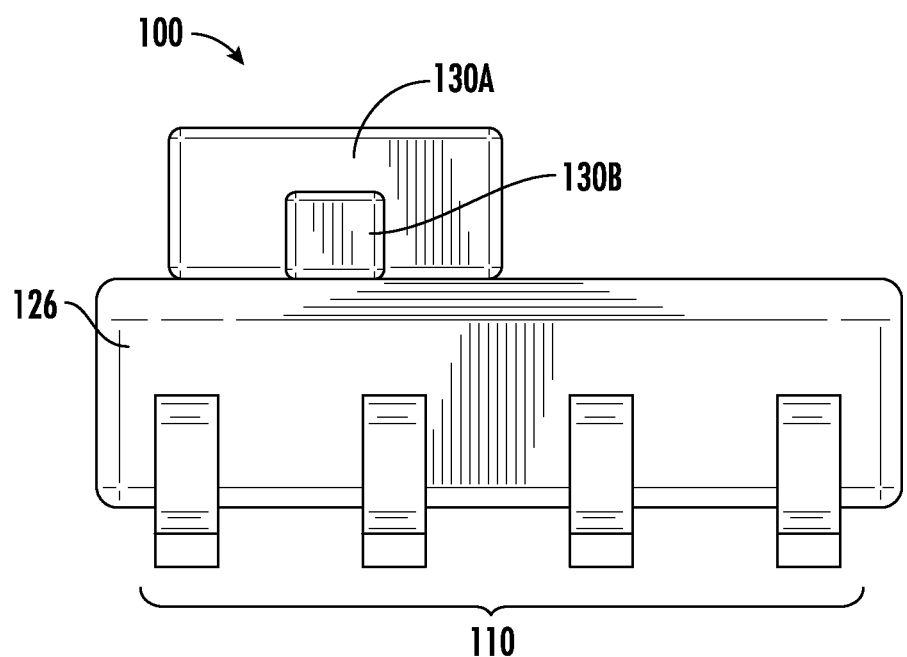
Figure 8C:
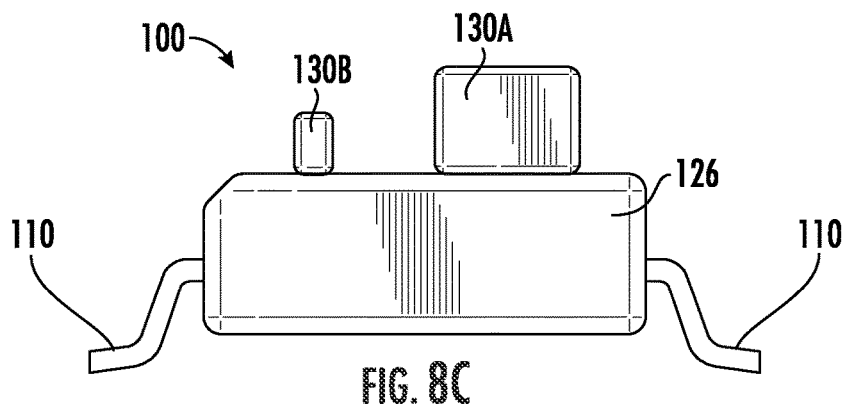
Figure 8D:
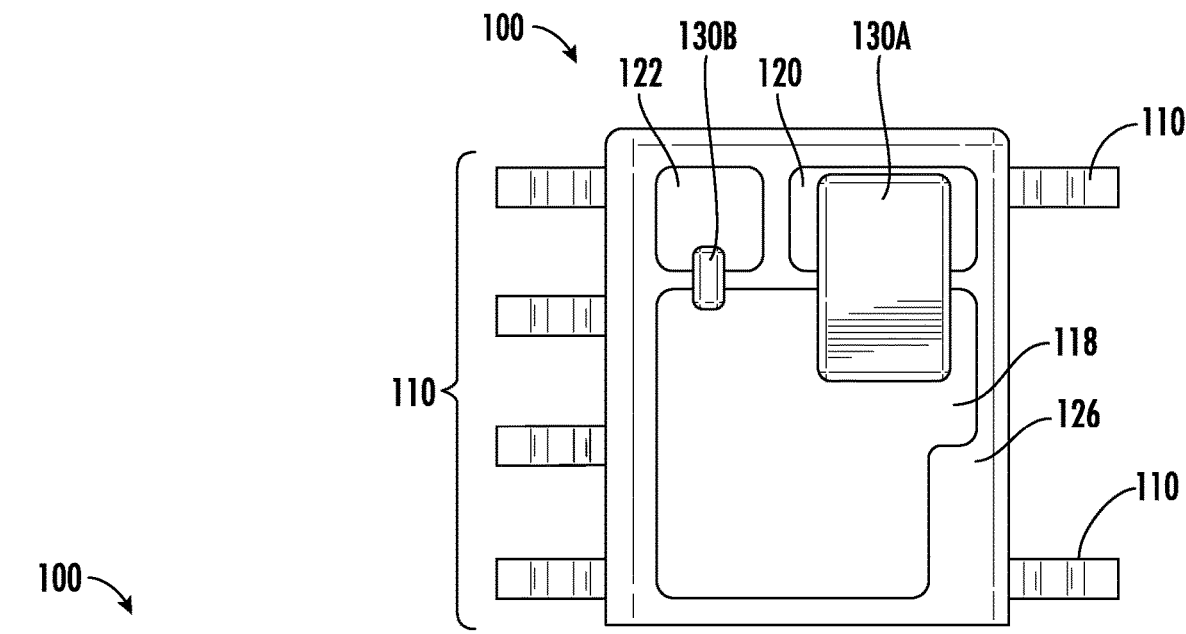
Figure 8E:
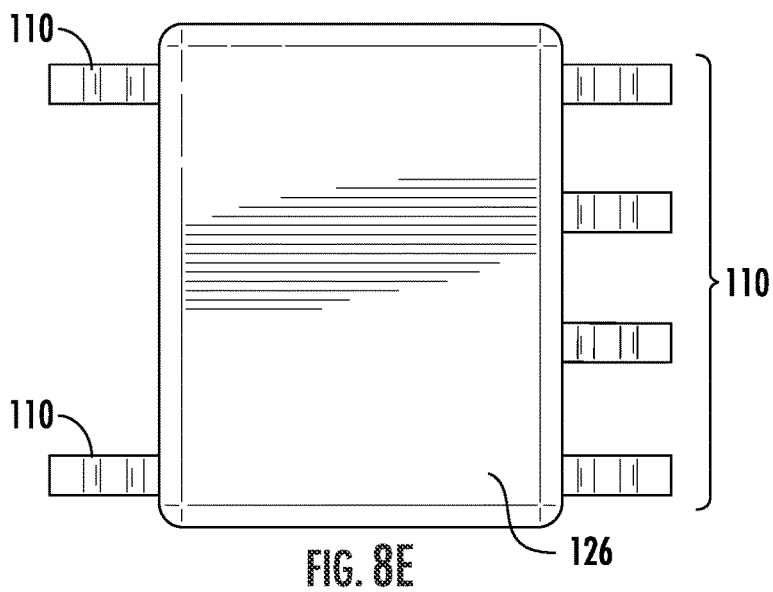

FIG. 7 is a top view of a schematic of components 130, such as 130A and 130B, mounted on the package 100, in accordance with some embodiments. The components 130A and 130B may include passive components such as capacitors, resistors, inductors, transformers or diodes, or semiconductor devices such as transistors, microcontrollers or dies. The components 130A and 130B may be coupled mechanically and electrically on the package 100 utilizing the flags 118, 120, 122 which serve as terminals in an electrical circuit. In some embodiments, the component 130, such as components 130A and 130B, may be mounted and electrically connected across the first flag 118 and the second flag 120, or across the first flag 118 and third flag 122. In other embodiments, components 130A and 130B may be mounted on the package 100 at the same time such as the component 130A across the first flag 118 and the second flag 120, and the component 130B across the first flag 118 and the third flag 122. In some embodiments the components 130A and 130B may be soldered to the flags or to the top surface of the package 100. In other embodiments, the components 130A and 130B may be bonded to the flags 118, 120, 122 using conductive epoxy.

FIGS. 8A-8E are a perspective view, front view, side view, top view and bottom view respectively, of the package 100 with components 130A and 130B mounted thereon, in accordance with some embodiments. The process 500 enables the lead frame 102 to have multiple roles such as providing structure for the package 100, providing a mounting location for the semiconductor die 116, providing a support surface to mount the components 130A and 130B, and acting as conductive surfaces which are integral with the lead fingers 110. For example, the exposed portions of the lead frame 102—the flags 118, 120, 122—are the conductive surfaces which are continuous or the same piece of material as the lead fingers 110. The flags 118, 120, 122 being continuous with the plurality of lead fingers 110 are formed as a by-product of the stamping process without adding steps, complicated manufacturing or intervening materials.

In the art, conductive surfaces for connecting to components are generally located inside of the package and built up by a layering process of conductive and insulating layers. This adds material, steps, processes and cost over the package 100 and the process 500 disclosed herein. In contrast, the package 100 and the process 500 enable the flags 118, 120, 122 which are exposed portions of the lead frame 102 to be used as the conductive surfaces.

In the art, a component may attach to a package by using an intervening material and/or added processes. For example, a component located inside or outside of the package may attach to the package via an intervening material or intermediate element such as a metal in the shape of a pillar or column pattern formed by using another technology suitable for depositing, extruding, embossing, and/or forming metal, or another substance suitable for forming an electrically conductive and/or thermally conductive connection. In this manner, there may be a stack of layers, such as the connection on the component to an intervening material to the connection on the package (which may or may not be the leads) which increases manufacturing complexity. In contrast, in some embodiments, the package 100 is formed with a less complex stamping process that does not require such intervening material, thereby reducing a cost to manufacture the package 100.

Generally, components such as passive components, are located inside of the package, forcing the size to the package to sprawl, which takes up more space on a circuit board when the package is mounted to the circuit board. The package 100 has the conductive surfaces (e.g., the flags 118, 120 and 122) located on the top surface of the package 100. These are exposed portions of the lead frame 102 (e.g., the body 104) which are integral with the lead fingers 110, and enable components 130, such as components 130A and 130B, to be mounted above the package 100 instead of inside of the package. Thus, the vertical space on the top side of the package 100 is utilized, thereby creating a package 100 with a smaller footprint. Also, by mounting the components 130A and 130B outside of the package, components 130A and 130B (e.g., passive components) can be added later, such as post-sale, instead of during manufacturing which can expand or customize the capabilities of the package 100. In this way, the functionality of a circuit can be adapted by varying the components to different boundary conditions.

In the art, packages are typically configured for one mode of operation. In order to operate in other modes, packages may be reconfigured such as by adding components. The package 100 has multiple capabilities or modes of operation using the example configuration as disclosed. For example, the package 100 has a single lead frame 102 and with this configuration, the lead finger can be connected to a flag only, or to a semiconductor die only, or to a flag and a semiconductor die.

Figure 9:
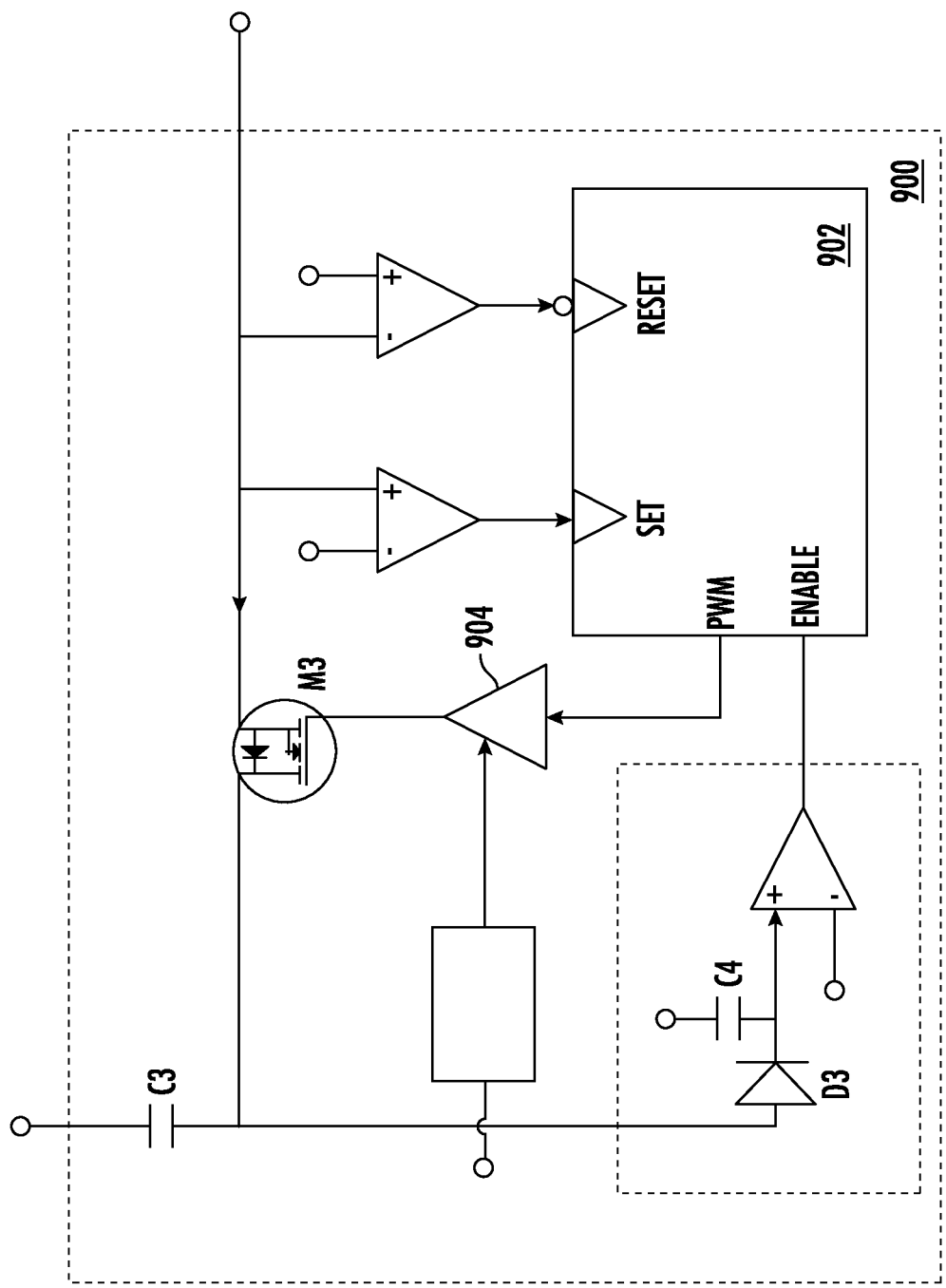
FIG. 9 is a schematic of an example circuit configuration of the package, in accordance with some embodiments.

FIG. 9 is a schematic of a portion of an example circuit configuration of the package 100, in accordance with some embodiments. For example, a self-driven active clamp circuit 900 may be in the package 100. The capacitors C3 and C4 and/or the diode D3 may be passive components mounted on the top of the package 100. In other embodiments, the diode D3 may be a semiconductor device mounted on the top of the package 100. The active clamp circuit 900 may include an active clamp switch controller circuit 902 which provides an active clamp switch control signal to the active clamp switch M3 via a gate driver circuit 904.

In further embodiments, three or more passive components may be mounted on the package 100 depending on the number of flags and design application. The present embodiments may be applied to other packages such as small outline integrated circuit packages (SOIC), small-outline J-leaded packages (SOJ), thin-shrink small-outline packages (TSSOP), thin quad flat packages (TQFP) or the like.

What is claimed is:

1. A device comprising:
    a first finger of a plurality of lead fingers of a lead frame connected to a first flag;
    a second finger of the plurality of lead fingers of the lead frame connected to a second flag;
    a semiconductor die coupled to the lead frame; and
    an encapsulant covering the semiconductor die, the lead frame, and a first end of the plurality of lead fingers, excluding the first flag and the second flag, wherein the first flag and the second flag are separated and electrically isolated from one another by the encapsulant.

2. The device of claim 1, wherein the first flag is a first exposed portion of the lead frame and the second flag is a second exposed portion of the lead frame.

3. The device of claim 1, wherein the first flag and the second flag comprise conductive surfaces.

4. The device of claim 1, wherein the semiconductor die is electrically connected to the first flag and the second flag.

5. The device of claim 1, wherein a second end of each lead finger of the plurality of lead fingers is laterally displaced from the first flag and the second flag.

6. The device of claim 1, wherein the first flag is a first terminal of an electrical circuit and the second flag is a second terminal of the electrical circuit when electrically connected to a component.

7. The device of claim 6, wherein the component is a capacitor, resistor, inductor, transformer, diode, transistor, microcontroller, or die.

8. The device of claim 1, further comprising a third finger of the plurality of lead fingers of the lead frame, and connected to a third flag, the third flag being a third exposed portion of the lead frame.

9. The device of claim 8, wherein the semiconductor die is electrically connected to the third flag.

10. The device of claim 9, wherein the first flag is a first terminal of an electrical circuit and the third flag is a second terminal of the electrical circuit when electrically connected to a component.

11. The device of claim 9, wherein a first component is connected to the first flag and the second flag, and a second component is connected to the first flag and the third flag.

12. A process comprising:
    forming a lead frame from a material, the lead frame comprising:
        a first finger of a plurality of lead fingers connected to a first flag;
        a second finger of the plurality of lead fingers connected to a second flag;
    coupling a semiconductor die to the lead frame;
    connecting the semiconductor die to the first flag and the second flag; and
    encapsulating the semiconductor die, the lead frame, and a first end of the plurality of lead fingers, excluding the first flag and the second flag, with an encapsulant;
    wherein the first flag and the second flag are separated and electrically isolated from one another by the encapsulant.

13. The process of claim 12, wherein the forming of the lead frame comprises a stamping process.

14. The process of claim 12, wherein the first flag is a first exposed portion of the lead frame and the second flag is a second exposed portion of the lead frame.

15. The process of claim 12, wherein the first flag and the second flag comprise conductive surfaces.

16. The process of claim 12, wherein a second end of each lead finger of the plurality of lead fingers is laterally displaced from the first flag and the second flag.

17. The process of claim 12, further comprising connecting a component to the first flag and the second flag, wherein the first flag is a first terminal of an electrical circuit and the second flag is a second terminal of the electrical circuit.

18. The process of claim 17, wherein the component is a capacitor, resistor, inductor, transformer, diode, transistor, microcontroller or die.

19. The process of claim 12, further comprising a third finger of the plurality of lead fingers of the lead frame, and connected to a third flag, the third flag being a third exposed portion of the lead frame.

20. The process of claim 19, wherein the third flag is separated and electrically isolated from the first flag and the second flag by the encapsulant.

\* \* \* \* \*